United States Patent [19]
Kakehi et al.

[11] Patent Number: 5,646,489
[45] Date of Patent: *Jul. 8, 1997

[54] PLASMA GENERATOR WITH MODE RESTRICTING MEANS

[75] Inventors: Yutaka Kakehi, Hikari; Yoshinao Kawasaki, Kumage-gun; Keizo Suzuki, Kodaira; Kazuo Nojiri, Higashimurayama; Hiromichi Enami, Tachikawa; Tetsunori Kaji, Tokuyama; Seiichi Watanabe; Yoshifumi Ogawa, both of Kudamatsu, all of Japan

[73] Assignee: Hitachi, Ltd., Tokyo, Japan

[*] Notice: The term of this patent shall not extend beyond the expiration date of Pat. No. 5,433,789.

[21] Appl. No.: 432,861

[22] Filed: May 2, 1995

Related U.S. Application Data

[63] Continuation of Ser. No. 10,051, Jan. 28, 1993, Pat. No. 5,433,789.

[30] Foreign Application Priority Data

Jan. 30, 1992 [JP] Japan ................................. 4-14729
Jul. 20, 1992 [JP] Japan ................................. 4-191878

[51] Int. Cl.⁶ ........................................... H05H 1/46
[52] U.S. Cl. ........................ 315/111.21; 118/723 MW; 118/723 ME; 118/723 MR; 156/345; 313/231.31; 333/998 L
[58] Field of Search .................... 315/111.01, 111.21, 315/111.41, 111.51; 313/231.31; 204/298.38; 118/723 MW, 723 ME, 723 MR; 333/251, 99 PL; 156/345

[56] References Cited

U.S. PATENT DOCUMENTS

| | | | |
|---|---|---|---|
| 4,866,346 | 9/1989 | Gaudreau et al. | 315/111.21 |
| 4,877,509 | 10/1989 | Ogawa et al. | 156/345 X |
| 4,985,109 | 1/1991 | Otsubo et al. | 204/298.38 X |
| 5,078,823 | 1/1992 | Chollet et al. | 156/345 |
| 5,081,398 | 1/1992 | Asmussen et al. | 315/11.21 X |
| 5,134,965 | 8/1992 | Tokuda et al. | 204/298.38 X |
| 5,270,616 | 12/1993 | Itatani | 315/111.21 |
| 5,433,789 | 7/1995 | Kakehi et al. | 315/111.21 X |

FOREIGN PATENT DOCUMENTS

| | | | |
|---|---|---|---|
| 0264913 | 4/1988 | European Pat. Off. | |
| 0284436 | 9/1988 | European Pat. Off. | 315/111.21 |
| 0398832 | 11/1990 | European Pat. Off. | |
| 0420117 | 4/1991 | European Pat. Off. | |
| 0434933 | 7/1991 | European Pat. Off. | |
| 63-60530 | 3/1988 | Japan . | |
| 1197999 | 8/1989 | Japan | 315/111.21 |
| 2-139900 | 5/1990 | Japan . | |
| 2-67636 | 5/1990 | Japan . | |
| 4-355915 | 12/1992 | Japan | 315/111.41 |
| 5198388 | 8/1993 | Japan | 315/111.41 |
| 88/08659 | 11/1988 | WIPO . | |

OTHER PUBLICATIONS

M. Pichot et al., "Plasmas multipolaires microondes: Etat de l'art et applications", *Le Vide, les Couches Minces*, vol. 46, No. 255, Jan.–Feb. 1991, pp. 1–20 (in French).

*Primary Examiner*—Benny T. Lee
*Assistant Examiner*—Justin P. Bettendorf
*Attorney, Agent, or Firm*—Antonelli, Terry, Stout & Kraus, LLP

[57] ABSTRACT

A plasma processing apparatus has a waveguide along which microwaves are propagated from a microwave generator to a plasma-forming region in a low-pressure processing chamber. The waveguide has a large cross-sectional area, to enable a large region of plasma to be achieved. Uniformity and stability of the plasma are improved by a mode restrictor which inhibits mixing of propagation modes which is otherwise liable to occur in a wide waveguide. The mode restrictor consists of electrically conductive dividers which divide the waveguide cross-section into an array of subguides before the plasma-forming region.

46 Claims, 11 Drawing Sheets

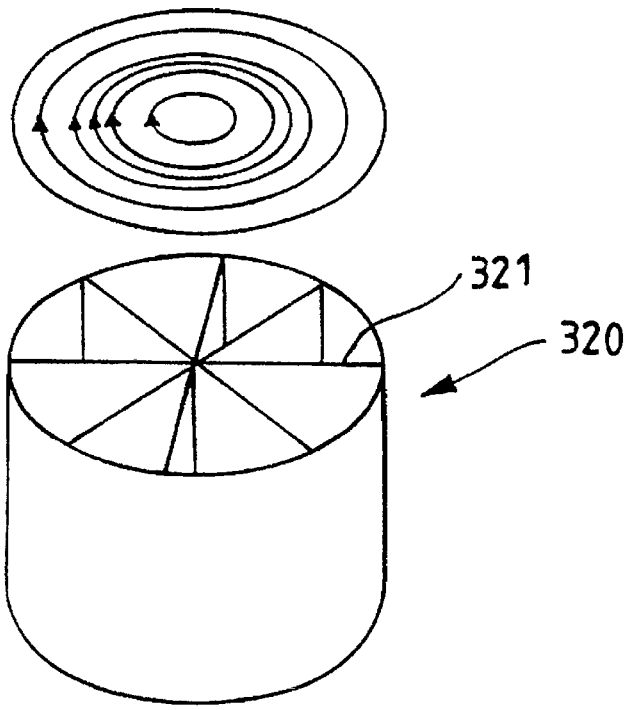
Fig.6a.
Fig.6b.
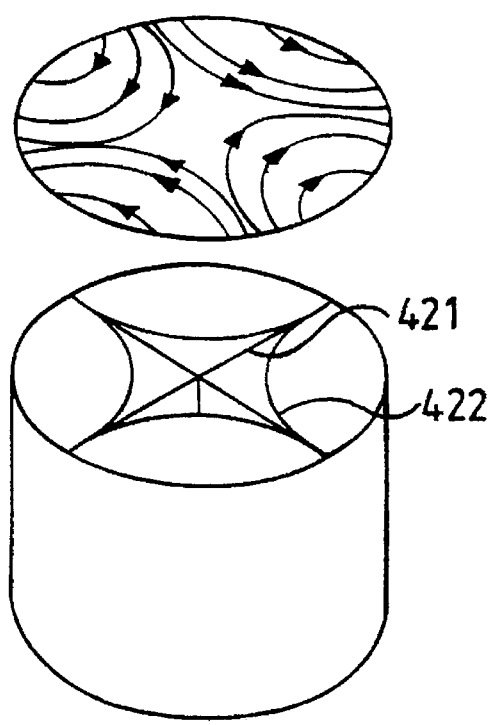
Fig.7a.
Fig.7b.

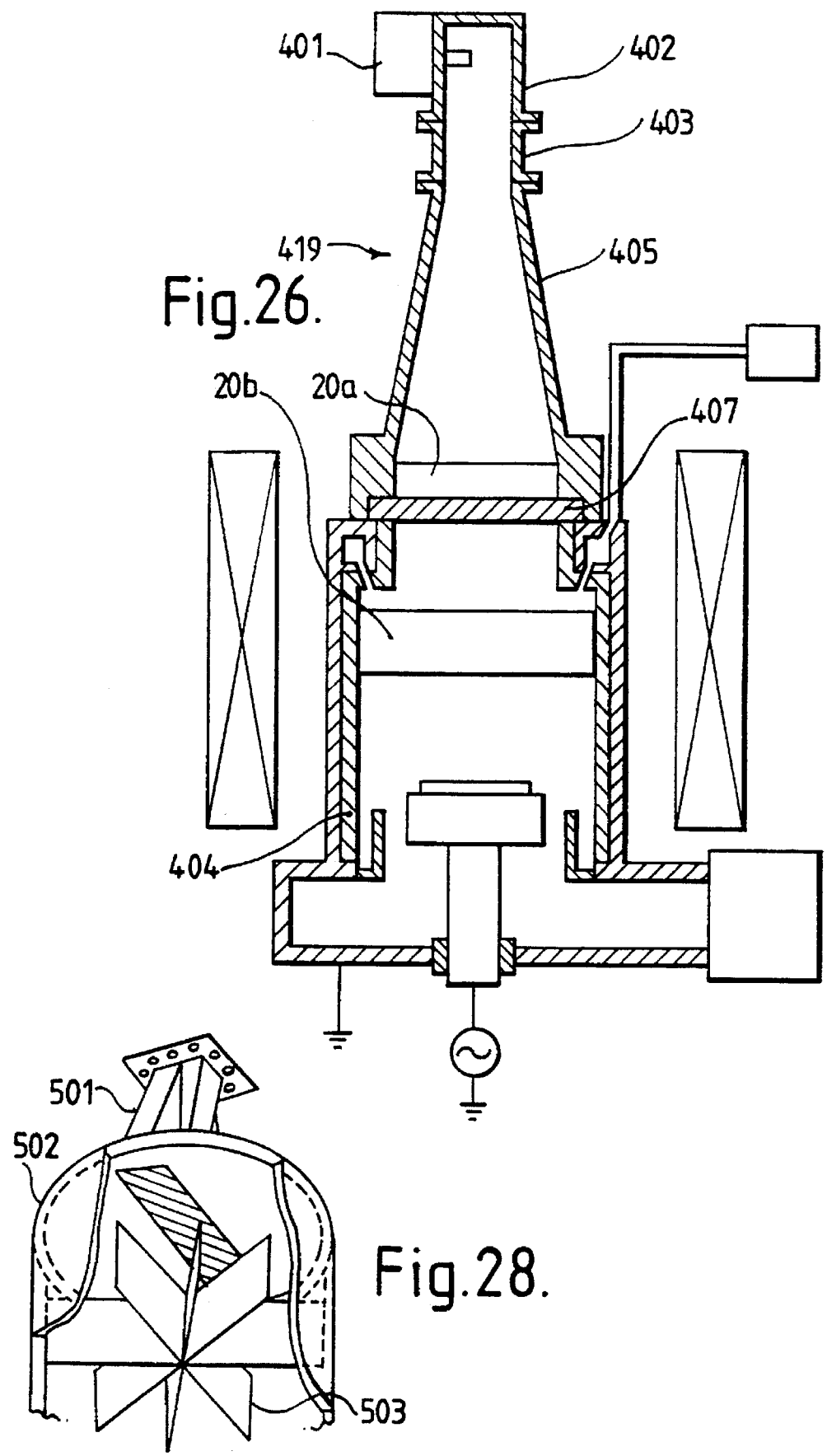

PLASMA GENERATOR WITH MODE RESTRICTING MEANS

CROSS-REFERENCE TO RELATED APPLICATION

This is a continuation of application Ser. No. 08/010,051 filed on Jan. 28, 1993, now U.S. Pat. No. 5,433,789.

FIELD OF THE INVENTION

This invention relates to methods and apparatus for generating plasma, and to applications of the generated plasma in the processing of substrates, particularly semiconductor substrates.

BACKGROUND OF THE INVENTION

The basic techniques of plasma generation using microwaves are well known. See e.g. "Semiconductor Plasma Processing Technique" (Sugano, published by Sangyo Tosho, page 139). Electric fields created by microwaves and an external magnetic field act together in a discharge tube to create a plasma which is used for treating e.g. semiconductor wafers.

As semiconductor technology advances, the size of semiconductor wafers increases. To plasma-process such wafers, the propagating waveguide for the microwaves must also be enlarged, so that a larger area of plasma can be created. However, the increase in waveguide area brings with it certain problems, which reduce the quality and consistency of the plasma processing currently available with large-section waveguides.

DESCRIPTION OF THE PRIOR ART

Japanese Patent 63-60530 notes that the microwave energy tends to concentrate in the center of the waveguide, so that plasma is not formed at the peripheral regions. To solve this problem, it is proposed to divide the waveguide into a number of equal sections extending side by side. Each of these sections would have its own central concentration of microwave power, so that power would be better distributed over the waveguide as a whole.

Japanese Utility Model 2-67637 is also concerned to enable plasma-forming towards the edge of a circular waveguide. The waveguide space is sub-divided by a concentric insert cylinder and radial walls extending outwardly from the cylinder. The cylinder is larger than the typical semiconductor specimen. The various subsections can be closed off, enabling microwave propagation to be selectively central and/or peripheral in the waveguide.

These prior art apparatuses achieve distribution of microwave energy over a wider area of the waveguide. But, the prior art still has serious problems of stability and uniformity of the plasma, particularly in a large-section waveguide.

SUMMARY OF THE INVENTION

The present inventors have discovered that to achieve a good plasma, it is not sufficient simply to distribute microwave energy across the waveguide section. Rather, we have discovered that a more fundamental problem with the plasma is related to the propagation modes of the microwaves. Where a waveguide has a large cross-section in relation to the microwave wavelength, a large number of different modes can propagate. This problem is particularly serious with the new, large apparatus required for processing large substrates. We have discovered that if many modes can propagate, the resulting plasma is unstable and lacks the uniformity needed for good processing.

Accordingly, it is an object of this invention to control and select the propagation modes of microwaves arriving at the plasma-forming region, so that a superior plasma can be achieved.

In a first aspect, the invention provides a plasma generating apparatus comprising a waveguide for guiding microwaves in a propagation direction from a microwave generator to a plasma-forming region, characterized by a mode restrictor in the waveguide to restrict the number of microwave propagation modes arriving at the plasma-forming region.

The mode restrictor may be made by subdividing the interior of the waveguide transversely to form a plurality of sub-guides extending side by side, and positioned so as to achieve the desired mode restriction effect. Appropriate positioning of the dividing walls for various modes can be determined by the skilled artisan on the basis of the principles explained herein, and routine calculations.

In the preferred construction of the present invention, to select a predetermined plasma-forming mode for plasma forming, each sub-guide is constructed so as to propagate microwaves selectively (and desirably exclusively) with a respective sub-pattern of electric force lines which, when combined with the other sub-patterns, is aligned with an overall pattern of electric force lines of the desired plasma-forming mode of the open waveguide.

It is important to note that the dividing walls used in the Japanese prior art documents mentioned above do not have any mode restricting effect. In JP-B-63-60530 the sub-patterns which propagate in the divided waveguide are not aligned with any mode of the undivided waveguide so that substantial mixing of modes will result downstream of the subdivisions. In JP-UM/1-2-67637 the central tube is too large to select aligned patterns.

Most preferably, the mode restrictor favors a single mode over all others. In particular, the chosen mode desirably contributes at least 80% and preferably at least 90% of the microwave energy after the mode restrictor. The preferred selected modes are simple modes, since these tend to produce the simplest and hence most useful plasma patterns. In particular, preferred plasma-forming modes are basic modes of the open waveguide, that is, modes of the type $TE_{xy}$ and $TM_{xy}$ where neither x nor y exceeds 1.

The portion of the waveguide between the mode restrictor and the plasma-forming region is typically circular or rectangular in cross-section, and preferably circular since this corresponds to the symmetry of the typical substrate. In a circular waveguide, the most preferred plasma-forming mode is the $TE_{11}$ mode since this has a single area of high microwave intensity positioned centrally.

Because the restriction of modes contributes to stability and uniformity of the plasma, it becomes possible to form plasma in very wide waveguides. In particular, the waveguide width at and following the mode restrictor may be 300 mm across or more, perhaps 400 mm across or more.

The dividers used to subdivide the waveguide section are preferably in plate form, extending parallel to the microwave propagation direction. Preferably the microwaves propagating down the respective sub-guides formed by the dividers are phase-matched, and this is enabled by making the length of the dividers, in the propagation direction, an integral multiple of one-quarter of the propagating wavelength of the microwaves. This is explained in more detail later.

The actual disposition of the dividers may be done in a number of ways, depending on the mode which is desired to be "filter", the precision with which this needs to be done, the ease of making the dividers, and other practical considerations.

In a preferred version, the plasma-forming mode is decided on and dividers are shaped and positioned in the waveguide so as to extend perpendicularly to the pattern of electric force lines of that predetermined mode. By curving the dividers, a substantially accurate modeling of the mode can be achieved. Desirably the dividers are placed sufficiently close to one another, and to the outer waveguide wall, that substantially only one mode propagates in each. In particular, the spacing of successive dividers in the direction along the electric force lines of the selected mode pattern is desirably less than the cut-off wavelength of any secondary (nonbasic) microwave mode but desirably larger than the cut-off wavelength of a primary (basic) microwave mode in the sub-guide concerned. This prevents any higher order modes or reversal of force line patterns from developing in that direction.

The waveguide may take various forms. The simplest form has a wide cross-section all the way along, but this is not preferred because of the immediate proliferation of modes at the location of the generator. It is preferred to use the conventional approach, having a first relatively narrow waveguide portion leading to a second relatively wide waveguide portion which leads to the plasma-forming region. A transitional portion, at which the cross-sectional area changes, may be a simple step but is desirably a gradually (non-perpendicularly) diverging portion since this is found to cause less mode mixing.

The mode restrictor should generally be placed at the second portion, i.e. in the second portion itself, or at the second end of the transitional portion. Preferably the waveguide cross-section remains substantially uniform after the mode restrictor. If it does not, a further mode restrictor may be used. Generally speaking, there should be a mode restrictor at or after any feature of the waveguide which is liable to cause mixing of modes.

In another aspect, the invention provides a plasma processing apparatus, e.g. suitable for plasma processing semiconductor substrates, in which a processing chamber has a substrate-support platform in combination with a plasma generating system as described above, the platform being positioned so that substrates supported on it will be exposed to plasma formed at the plasma-forming region. Preferably the platform is rotatable. The processing chamber may be of the conventional type, that is, a sealed low-pressure chamber with means for introducing plasma-forming gas to the plasma-forming region.

In a further aspect, the invention provides a plasma generating method using a plasma generating apparatus as defined above. In particular, we provide a plasma generating method in which microwaves are propagated from a microwave generator along a waveguide to a plasma-forming region, with an enlargement of the waveguide tending to cause a mixing of propagation modes of the microwaves, and plasma is formed using the microwaves at the plasma-forming region, characterized by mode-filtering the microwaves in the enlarged waveguide to restrict the number of microwave propagation modes reaching the plasma-forming region.

The mode filtering or restricting effect can be achieved, as mentioned, by sub-dividing the microwave propagation through a plurality of sub-guides whose form is predetermined to achieve the desired mode restricting effect, and recombining the microwaves from the sub-guides to enter the plasma-forming region.

In a further aspect, the invention provides methods of semiconductor plasma processing using apparatuses and methods as described. In particular, the method may be applicable to semiconductor substrates—typically circular wafers—which are 200 mm or more across, and may be 300 mm or more across. In a specific method, the semiconductor substrate is positioned on a platform in a processing chamber, a plasma-forming gas is supplied into the processing chamber, a magnetic field is applied to a plasma-forming region in the processing chamber to which the substrate is exposed, and microwaves are directed at the plasma-forming region to form plasma from mode-restricted microwaves which have been guided as described above.

Concepts relating to the invention, and specific examples of the invention, will now be described in detail with reference to the accompanying drawings.

BRIEF DESCRIPTION OF THE DRAWINGS

FIGS. 4a, 4b, 5a, 5b, 6a, 6b, 7a, 7b, 8a, 8b, 9a, and 9b show respective embodiments of mode filters for use in embodiments of the invention, with figures ending in "a" showing a mode pattern and figures ending in "b" showing an appropriate filter construction;

FIG. 26 is a vertical section of a fifth embodiment of a plasma processing apparatus;

FIG. 28 is a perspective view of a further mode filter construction.

DETAILED DESCRIPTION OF THE PREFERRED EMBODIMENTS

Figure 1:
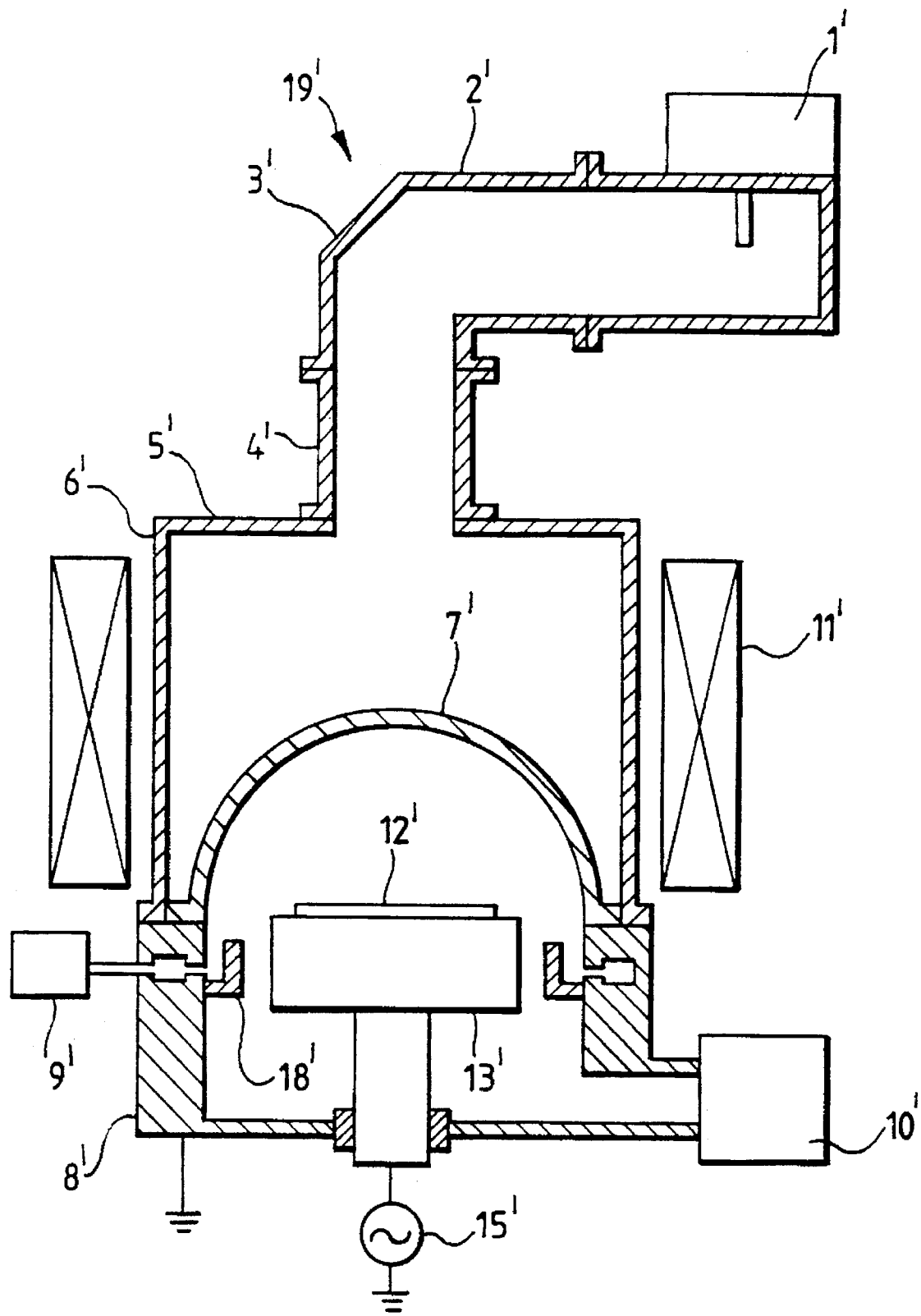
FIG. 1 shows a prior art plasma processor in vertical section.

FIG. 1 shows a conventional plasma processing apparatus. A microwave generator 1', typically a magnetron generating microwaves at 2.45 GHz, is connected to a waveguide 19' leading to a processing chamber defined by a metal vessel 8' covered by a quartz dome or bell jar top 7' in which a rotatable platform 13' for supporting a semiconductor wafer 12' constituting a specimen is provided. The processing chamber can be evacuated by suitable evacuating means 10'. Magnets 11' are positioned to apply a magnetic field to the region above the platform 13'.

A process gas is introduced into the processing chamber from a gas supply 9', while the evacuating means 10' maintaining a suitable low pressure. Microwaves interact with the applied magnetic field above the platform 13 to create a gas plasma from the introduced gas. Ions in the plasma are attracted and directed onto the specimen surface by RF voltage applied between the platform 13' from RF generator 15' and a ground electrode 18'.

The conventional waveguide has a narrow rectangular-section portion 2' extending from the microwave generator 1', a converter section 3' which angles the waveguide for compactness and converts the rectangular section to a circular section, a narrow circular-section portion 4', a cross-section increasing or transitional portion 5' and a large-diameter uniform circular-cross section portion 6' leading down to the plasma-forming region above the specimen. Typically the initial rectangular portion 2' might be 109×55 mm. In large state of the art constructions, the processing chamber may be 250 mm or more in inner diameter at the plasma-forming stage.

Figure 2:
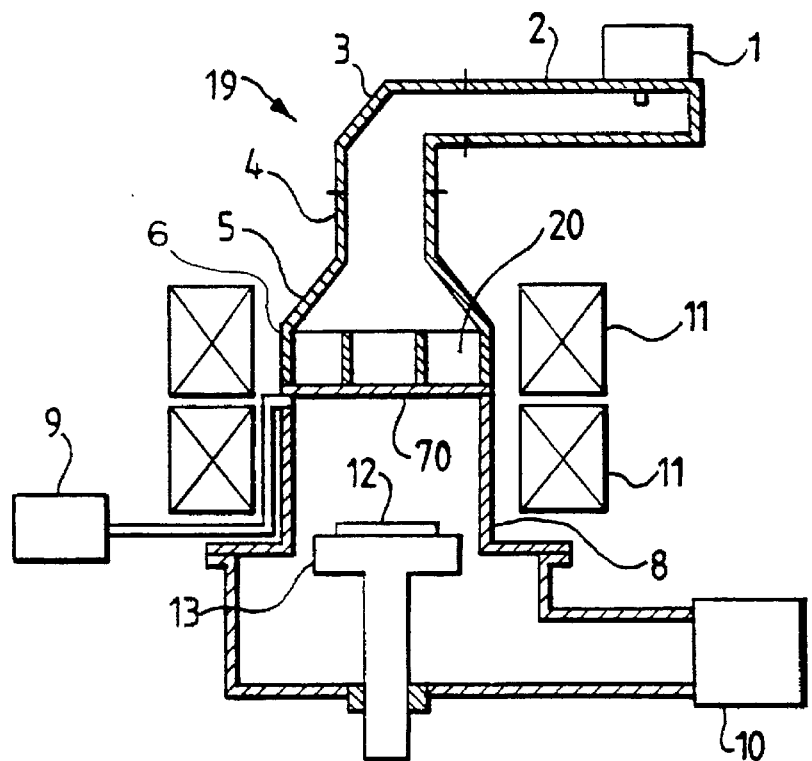
FIG. 2 shows in vertical section a plasma processor embodying the invention.

FIG. 2 shows a plasma processing apparatus embodying the invention. Parts corresponding to parts of the apparatus in FIG. 1 are indicated by the same reference numbers, without a prime sign. In this apparatus, the transitional portion 5 of the waveguide is not stepped as in FIG. 1 but tapers outwardly. The low-pressure processing chamber is separated from the waveguide 19 by a flat quartz window 70, instead of a quartz dome. Most importantly, the waveguide has a mode filter 20 positioned across it in the large-diameter circular cross-section portion 6 just below the diverging transitional portion 5 and just above the quartz window 70. The mode filter 20 controls and selects the microwave modes propagating in the waveguide towards the plasma-forming region above the platform 13.

A number of suitable constructions of the mode filter 20 will be described below. First, an explanation of microwave mode mixing will be provided.

Microwave propagation modes and their patterns are well known in themselves. See, for example, "Microwave Engineering and Applications" by O. P. Gandhi, Pergamon Press. In a waveguide which is narrow in relation to the wavelength, only one or two simple modes can propagate. As the waveguide becomes wider in relation to the wavelength, more and more modes can propagate.

Table 1 illustrates this for a circular waveguide of diameter D, indicating for each mode the cutoff wavelength $\lambda_c$ and the waveguide diameter corresponding to microwave cutoff at a frequency of 2.45 GHz. In a 300 mm waveguide, all seventeen listed modes can propagate.

TABLE 1

| Mode | $\lambda_c/D$ | Diameter for cutoff (mm) (f = 2.45 GHz) |
|---|---|---|
| TE11 | 1.705 | 71.8 |
| TM01 | 1.307 | 93.7 |
| TE21 | 1.029 | 119.0 |

TABLE 1-continued

| Mode | $\lambda_c/D$ | Diameter for cutoff (mm) (f = 2.45 GHz) |
|---|---|---|
| TM11 | 0.820 | 149.3 |
| TE01 | 0.820 | 149.3 |
| TE31 | 0.748 | 163.7 |
| TM21 | 0.612 | 200.1 |
| TE41 | 0.591 | 207.2 |
| TE12 | 0.589 | 207.9 |
| TM02 | 0.569 | 215.2 |
| TM31 | 0.492 | 248.9 |
| TE51 | 0.490 | 249.9 |
| TE22 | 0.468 | 261.7 |
| TM12 | 0.448 | 273.3 |
| TE02 | 0.448 | 273.3 |
| TE61 | 0.418 | 292.9 |
| TM41 | 0.414 | 295.8 |

Generally, the content of higher modes is less than that of lower modes. However, the content of a mode also depends on the symmetry of the original exciting mode.

In a typical plasma processing apparatus, microwaves are generated and first propagated in a narrow waveguide, commonly a rectangular waveguide, in which essentially only one mode (a $TE_{10}$-type mode) can propagate. When the form of the waveguide changes to a larger section, the change causes microwave reflections and the mixing of modes, and these mixed modes will persist if the subsequent waveguide is wide enough. However microwaves can propagate with substantially a single mode in a wide waveguide, provided that the mixing of other modes is properly suppressed.

Figure 3A:
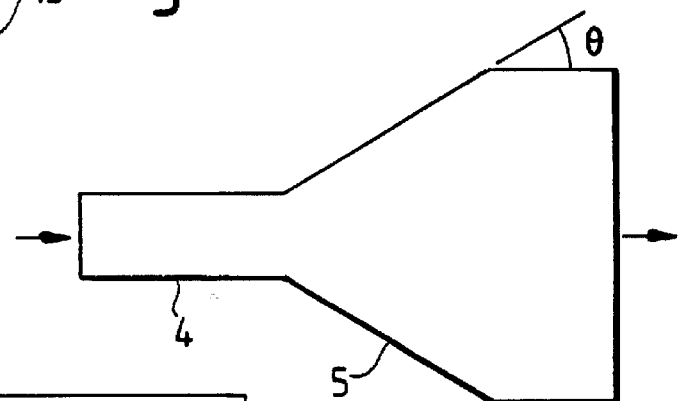
FIGS. 3a and 3b illustrate the mixing of modes in a diverging waveguide.

FIG. 3a illustrates the divergent transition of a circular-section waveguide from narrow to wide cross-section, at a diverging angle θ. In the first waveguide portion 4 (diameter 90 mm), only the basic circular mode $TE_{11}$ propagates. In the wide-section portion 6 (diameter 270 mm), a number of modes can propagate. The non-uniformity caused by the transitional portion 5 encourages the presence of mixed modes in the wide portion 6.

Figure 3B:
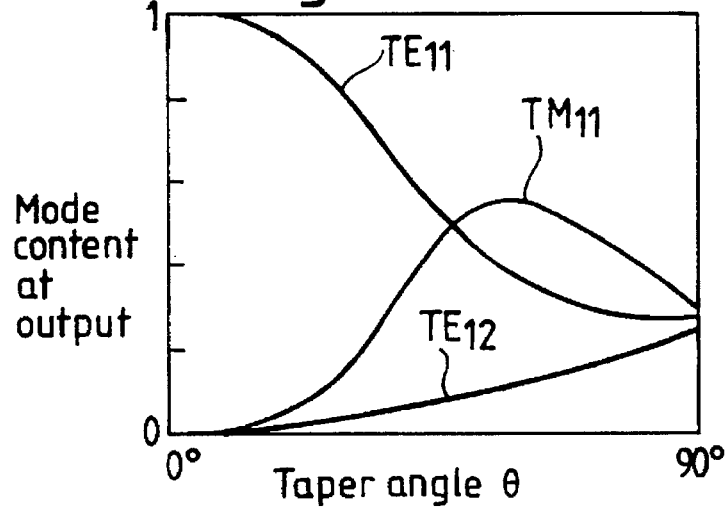

We plotted the energy contributions from various modes at the wide-section portion 6, according to the angle of the transitional portion 5. FIG. 3b shows how as the angle θ increased, the proportion of the exciting mode $TE_{11}$ gradually decreased at the output, with increasing contents of other modes, primarily $TM_{11}$ and $TE_{12}$, but also other modes not shown here. For a stepped transition (θ=90°) there were small contributions of comparable magnitude from the three different modes, with no single mode predominating.

The plot represents an ideal condition; in a real apparatus there are disturbances and waveguide non-uniformities which further increase the contents of other modes.

The mode filter or restrictor of the present apparatus is constructed to suppress the propagation of undesired modes in the wide-section waveguide so that only the desired mode—preferably a single basic mode—predominates in the (usually uniform) waveguide leading to the plasma-forming region.

Figure 4A:
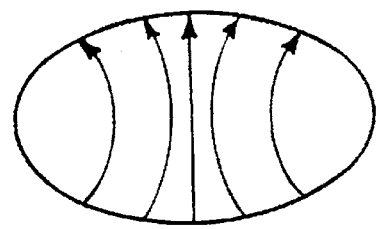
Figure 4B:
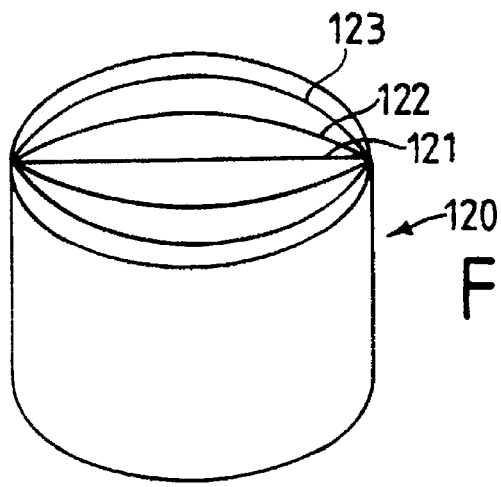

FIGS. 4a and 4b show a particularly preferred construction. In a circular waveguide, the $TE_{11}$ mode is of particular use because the microwave intensity is concentrated into a regular patch at the center of the waveguide. FIG. 4a shows the electric force line pattern of the mode $TE_{11}$. FIG. 4b shows the mode filter 120, in which the waveguide cylinder is bisected by a flat dividing plate 121 with a pair of arcuate dividing plates 122,123 of increasing curvature disposed on either side.

For at least most of its extent, each plate extends substantially perpendicularly to the electric force lines of the $TE_{11}$ mode. The distance between the plates is made sufficiently small in relation to the microwave wavelength such that only a single simple mode propagates in each of the sub-guides formed by the plates.

It will be understood that only an electric field corresponding substantially to the $TE_{11}$ pattern can persist past this filter. Other field patterns, involving electric fields with components along the plates, cannot be sustained in the filter.

With such a mode filter 120 installed in the large-diameter waveguide portion of the plasma processing apparatus, the microwaves propagating in that large-diameter portion are predominantly in the $TE_{11}$ mode and generate a stable plasma which has good properties for processing. If, however, the filter is placed in the small-diameter portion of the waveguide, bad results are obtained because the subsequent divergence of the waveguide causes mixing of modes.

Figure 5A:
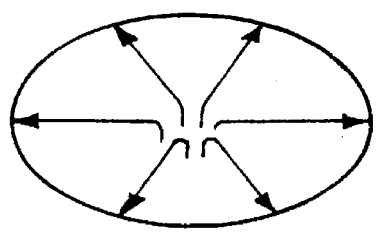
Figure 5B:
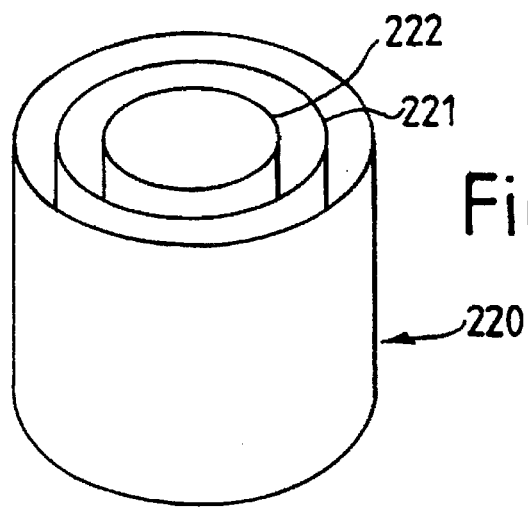

While $TE_{11}$ is a preferred mode, the stability obtained by "fixing" the propagation mode is also of value with other modes, particularly simple modes. FIG. 5a shows the electric force line pattern of the $TM_{01}$, mode, and FIG. 5b shows a mode filter 220 with a dividing wall construction which can propagate that mode selectively, namely a plurality of concentric metal cylinders 221,222. These cylinders are spaced sufficiently closely, in relation to the microwave propagation wavelength therein, such that essentially only one mode can propagate down the sub-guide spaces between them.

Correspondingly, FIGS. 6a and b show respectively the electric force line pattern for the circular $TE_{01}$ mode and a mode filter 320 with a plurality of flat radially extending plates 321 disposed at equal angles which selectively propagate a force line pattern aligned with that mode.

FIGS. 7a and b show respectively the electric force line pattern of the circular $TE_{21}$ mode and a dividing wall arrangement which promotes it while suppressing others modes, namely a subdivision into four equal segments by two perpendicular crossing walls 421, each segment being further divided by an inwardly convex arcuate plate 422.

Figure 8A:
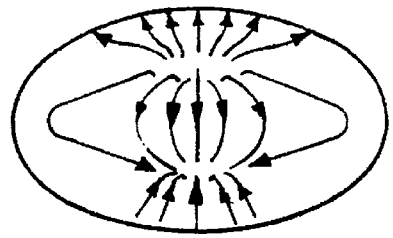
Figure 8B:
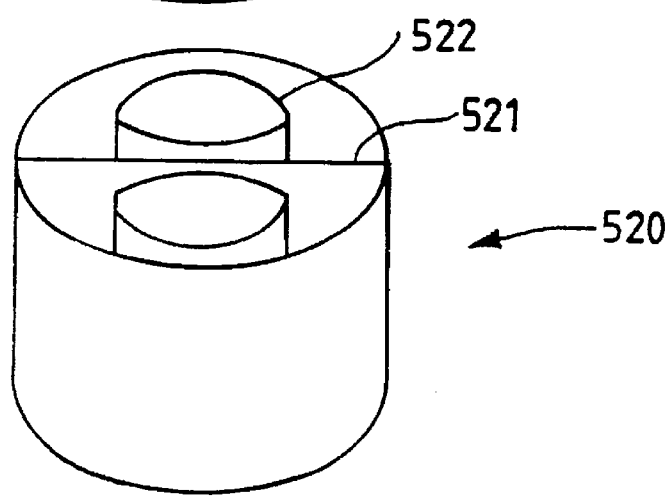

FIGS. 8a and b show respectively the electric force line pattern for the circular $TM_{11}$ mode and an appropriate mode filter 520. This has a single flat bisecting wall 521 and an elliptical-section tube 522 in each of the two resulting spaces.

Figure 9A:
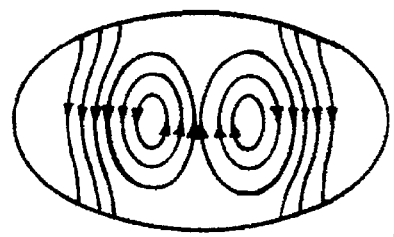
Figure 9B:
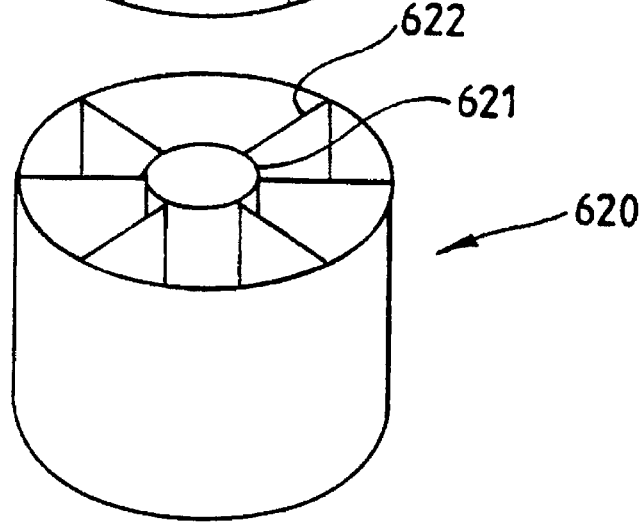

FIGS. 9a and b show respectively the electric force line pattern of the circular $TE_{12}$ mode and a suitable mode filter 620. This has a central concentric tube 621 with six radial walls 622 extending from the central tube 621 to the outer wall.

In each of the above mode filters, the dividing walls and of course the outer walls need to be of material suitable for a waveguide, that is, material in which at least the surface is electrically conductive, or behaves electrically conductively with microwaves. In practice metal plates are suitable, and aluminum plates are particularly preferred. As for thickness, excessive thickness tends to cause microwave reflection at the beginning and end of the filter. Conversely, if the walls are too thin, their shape tends to be unstable, their resistance higher and a heating problem arises. In practice, 0.5 to 3 mm is a preferred range of thickness.

As will be apparent to one of ordinary skill in the art from FIGS. 4a–4b, 5a–5b, 6a–6b, 7a–7b, 8a–8b, and 9a–9b, when the mode filter has a diameter of 270 mm for use in the large-diameter waveguide portion 6 shown in FIG. 3a and has dividing walls with thicknesses in the range of 0.5 to 3 mm referred to above, a total cross-sectional area of the sub-guide spaces formed by the dividing walls is greater than a total cross-sectional area of the dividing walls, and is substantially equal to a total cross-sectional area of the large-diameter waveguide portion 6.

It should be understood that the actual mode filters illustrated are not the only mode filters which are selective of the stated modes. In particular, the number of dividing walls may need to be varied according to the area of the waveguide in relation to the operational microwave frequency/wavelength to be used. For some modes, the necessity to maintain exact perpendicularity with the theoretical force line patterns over the cross-section will be more exacting than others. The theory of microwave propagation is well-established, and a skilled artisan will be able to determine any necessary changes by routine calculations, on the basis of the criteria stated herein.

The conventional microwave frequency used in such apparatuses is 2.45 GHz, the frequency of most commercially available microwave magnetrons. However, in practice, microwaves of any suitable frequency may be used, typically in a frequency range of 1.3 to 10 GHz.

The way in which the modes are filtered may also take account of the exciting mode, i.e. the propagation mode in the first portion of the waveguide leading from the microwave generator to the filter. It was explained earlier that when the $TE_{11}$ mode was supplied, $TM_{11}$ and $TE_{12}$ modes are the primary mixing modes at the output. If the microwaves are excited in a $TE_{01}$ mode, one of the fundamental modes, the primary mixing modes will be $TE_{21}$ and $TM_{21}$ modes. In that case, the mode restrictor may be designed with a specific view to suppressing those modes.

For the most effective operation, the design should take into account the phases of microwaves propagating in each of the sub-guides. If the phases are matched for the array of sub-guides, microwave reflections and mixing of modes can be minimized. To match the phases, the phase speeds (wave propagation speeds) of the microwave modes travelling in each sub-guide must be matched. That is, the actual in-guide wavelengths for the various sub-guides must ba the same.

Figure 10:
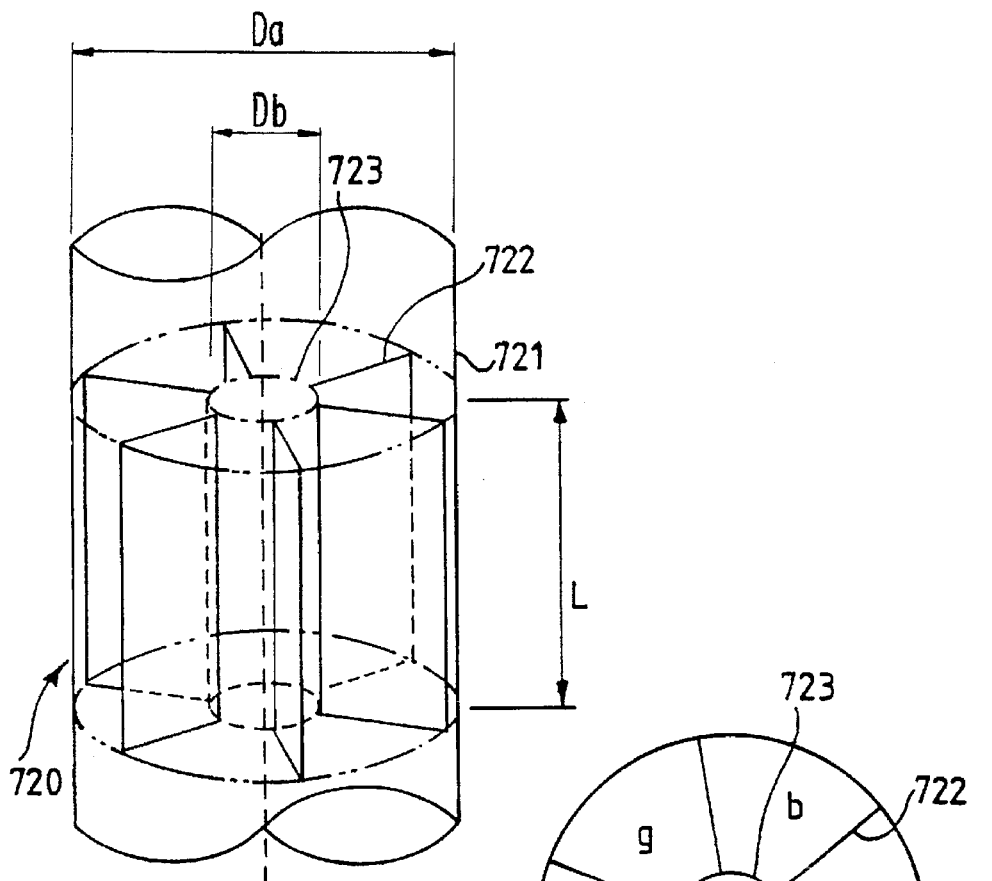
FIG. 10 is a perspective view, partly broken away, of a mode filter in a waveguide.

This concept of in-guide wavelength is explained further with reference to FIG. 10. The microwaves have a fixed operational frequency, with a wavelength $\lambda$ in a vacuum. In a given waveguide, the in-guide wavelength $\lambda_g$ depends on the shape and size of the waveguide and the mode which is propagating as follows:

$$1/\lambda_g^2 + 1/\lambda_c^2 = 1/\lambda^2$$

where $\lambda_c$ is a cutoff wavelength which can be calculated on the basis of the guide shape and size and the microwave mode.

Consider, for example, the central concentric tube 723 of the mode filter 720 shown in FIG. 10. For 2.45 GHz microwaves, $\lambda=122.4$ mm. The tube 723 has a diameter $D_b$. The $TE_{11}$ mode travelling through it has a cutoff wavelength $\lambda_c = 1.71 D_b$. The in-guide wavelength $\lambda_{b'}$ of the $TE_{11}$ mode travelling in the tube 723 can then be determined. Further, the fan shape of the sub-guide spaces defined by the walls 722 approximates a rectangle. The main waveguide or outer tube 721 diameter is $D_a$. The cutoff wavelength $\lambda_c$ of the rectangular mode $TE_{10}$ passing through such a guide space is $\lambda_c = \pi(D_a + D_b)/n$, where n is the number of segments, six in the case of FIG. 10. Again, the in-guide wavelength $\lambda_{c'}$ for the $TE_{10}$ mode in each sub-guide is determined. The dimensions can then be adjusted so that these in-guide wavelengths are equal to one another.

The overall length L of the filter is also significant. It is almost impossible to get perfect matching between the microwave mode patterns in and adjacent to the mode filter. When they are not perfectly aligned, some degree of microwave reflection occurs. To minimize this, the length L of the mode filter is preferably set to an integral multiple of ¼ of the in-guide wavelength λ' of the propagating mode. That is, L=h λ'/4, where h is a positive integer and it is assumed that all the in-guide wavelengths have been made equal. It is still more preferable if L=(2h+1) λ'/4.

The mode filter of FIG. 10 is described in more detail with reference to FIGS. 11, 12 and 13 wherein the same reference numerals represent the same parts. It represents a different approach from the embodiments of FIGS. 4a, 4b, 5a, 5b, 6a, 6b, 7a, 7b, 8a, 8b, 9a, and 9b. In this approach, the waveguide interior is subdivided into sub-guide spaces including quasi-rectangular spaces which "mimic" portions of a mode of the undivided waveguide interior.

Figure 11:
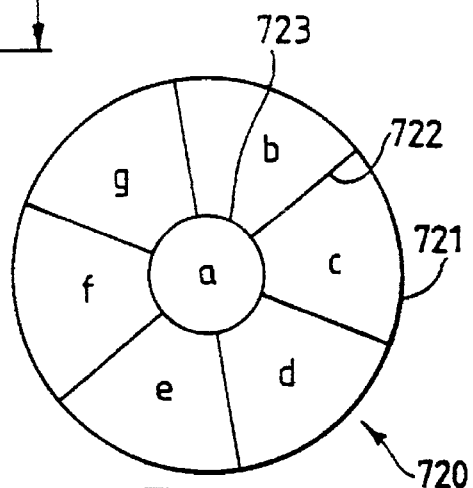
FIG. 11 is a transverse cross-section of the FIG. 10 mode filter.

The FIG. 10 and 11 embodiment has a central concentric tube 723 and six equi-spaced radial dividing walls 722 extending to the outer tube 721. The interior is thus divided into seven unit guide spaces a, b, c, d, e, f, and g, in each of which two arbitrarily selected points can be connected by a curve contained in that space. The size of the unit guide spaces a, b, c, d, e, f, and g is made sufficiently small to limit the microwave modes that can propagate therein.

Figure 12:
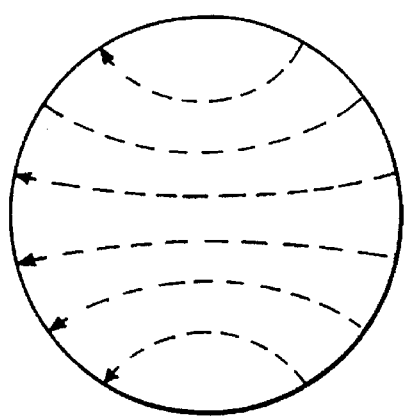
FIG. 12 shows a $TE_{11}$ mode in the open waveguide.

FIG. 12 shows the electric force line pattern of the circular $TE_{11}$ mode of an open circular waveguide, which is a major component propagating to the mode filter and which it is desired to select as the component propagating from the mode filter to the plasma-forming region.

Figure 13:
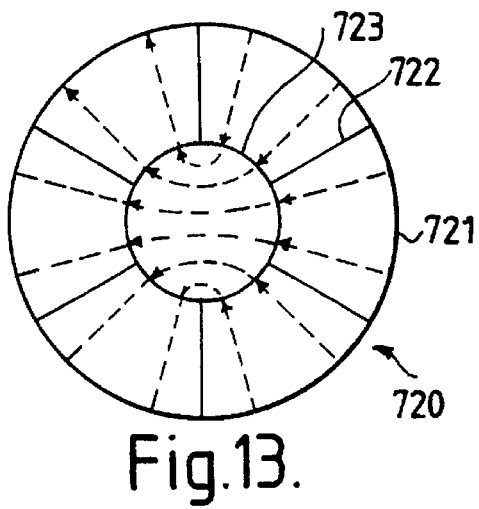
FIG. 13 shows how the mode filter of FIGS. 10 and 11 mimics the $TE_{11}$ mode.

FIG. 13 shows the electric force lines of the restricted modes that can propagate through the sub-spaces of the sub-divided waveguide at the mode filter. The inner tube 723 is so small that, unlike the outer tube 721, no mode higher than $TE_{11}$ can propagate in it. The "sub-pattern" of this $TE_{11}$ sub-mode, excited by the incoming corresponding mode, is shown in the center of FIG. 13. Conversely, each of the outer segment spaces behaves like a rectangular guide, sufficiently small such that only the rectangular $TE_{10}$-type of mode can propagate. The electric force sub-patterns of these $TE_{10}$-type modes are indicated around the periphery of FIG. 13. It can be seen that, in combination, the electric force line patterns which are selectively propagated by the various sub-spaces can provide an approximation of the overall electric force line pattern of the main waveguide $TE_{11}$ mode seen in FIG. 12. Conversely, they are wholly inconsistent with other simple modes of the main waveguide. Consequently, this mode filter tends to promote propagation of the $TE_{11}$ mode in the main waveguide after the filter. Even if microwaves arriving at the filter are in a mixture of modes, the small size of the sub-guides in the filter compels propagation in only the simple modes shown, which then lead to the $TE_{11}$ mode predominating subsequently. In other words, the mode filter works as a pass filter for the $TE_{11}$ mode.

FIGS. 14 to 17 show other possible mode filters.

Figure 14:
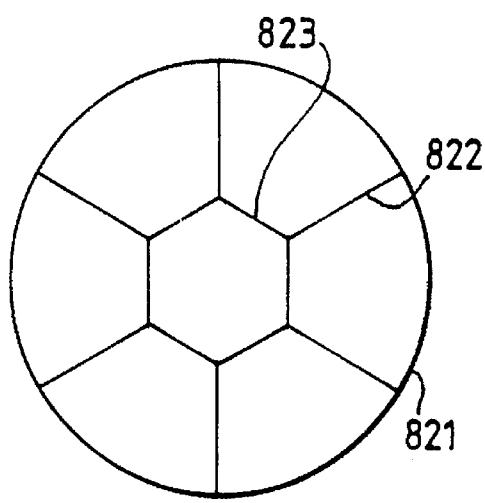
FIGS. 14 to 17 are transverse cross-sections through other embodiments of mode filters.

In FIG. 14, the central tubular conductor 823 is polygonal, with a radial wall 822 extending from each vertex of the polygon—here a hexagon—to the outer wall 821.

Figure 15:
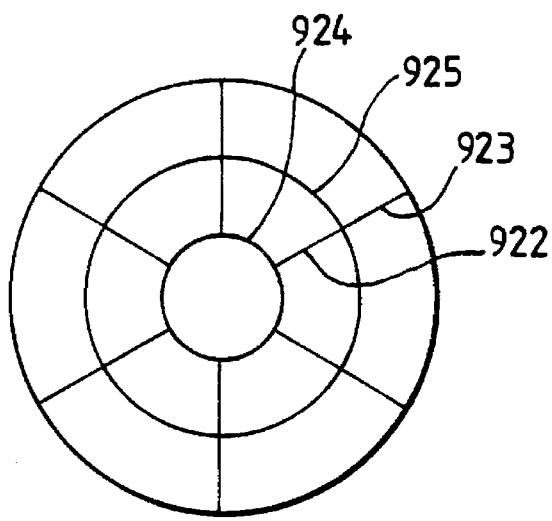
Figure 16:
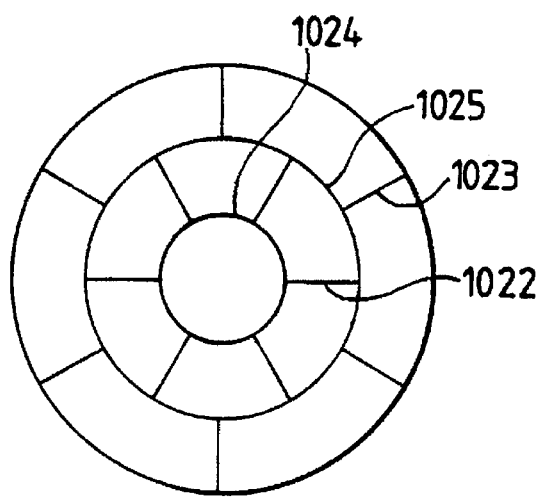

In FIGS. 15 and 16, two concentric tubular dividers 924,925 and 1024, 1025 are positioned inside the main waveguide. This may be necessary in very large-diameter waveguides in which higher modes might be able to propagate in the outer segments of a simple structure such as shown in FIGS. 11 or 14.

In FIG. 15, the inner and outer radial wall sections 922,923 are aligned. In FIG. 16, the inner and outer radial wall sections 1022,1023 are staggered relative to one another.

Figure 17:
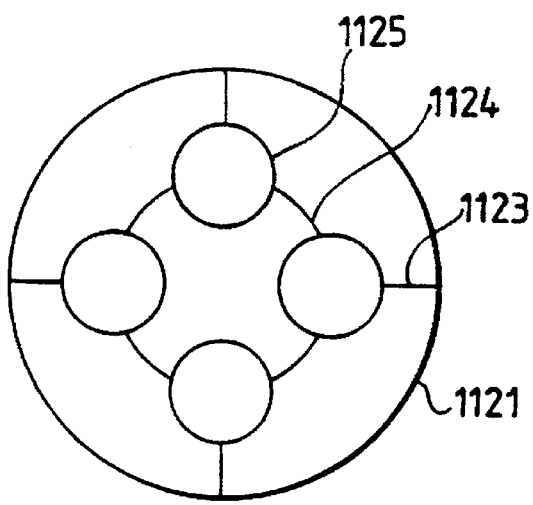

FIG. 17 shows a plurality of tubular sub-guides 1125 arranged on a circle, connected to one another by circumferential wall sections 1124 and to the outer wall 1121 by radial wall sections 1123. This structure is suitable for propagating a mode with single rotational symmetry.

Figure 18:
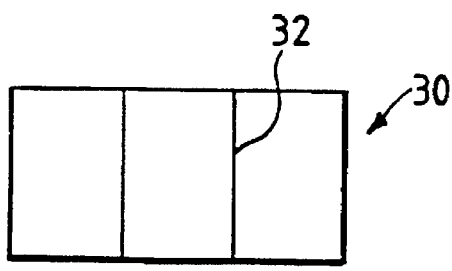
FIGS. 18 and 19 show mode filter construction in a rectangular waveguider
Figure 19:
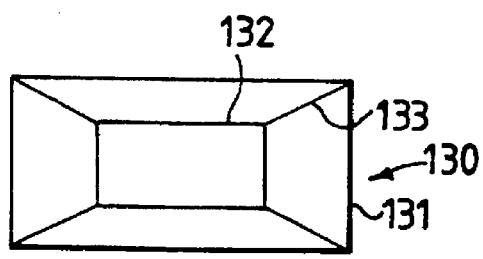

The mode filters described have all been in the context of a circular waveguide. However, the same concept can be applied in waveguides of other cross-sectional shape, e.g. oval or polygonal. In some of these, microwave modes correspond to those of a circular waveguide. The concept may also be applied to a rectangular guide. FIGS. 18 and 19 show mode filters within a rectangular section waveguide. The FIG. 18 mode filter 30 divides the rectangular guide into three equally-sized sub-guides using two flat dividing walls 32. The FIG. 19 mode filter 130 positions a rectangular-section tube 132 concentrically inside the main tube 131, with flat walls 133 linking the corresponding vertices of the two tubes.

Figure 20:
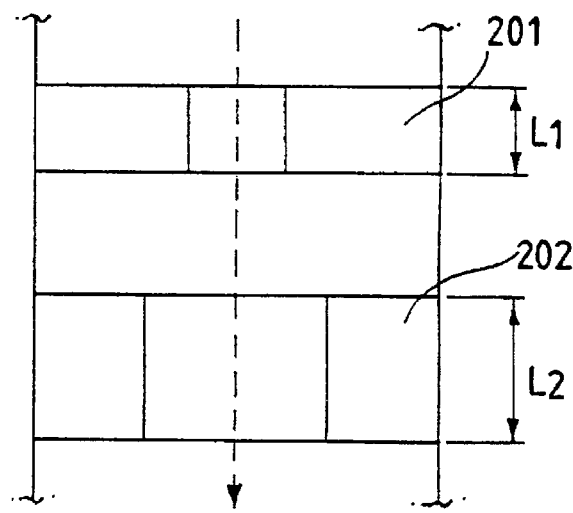
FIG. 20 shows two mode filters in series.

FIG. 20 shows how a plurality of mode filters or restrictors may be positioned in series. Two restrictors 201,202 are shown in FIG. 20 and have different structures and different lengths $L_1$, $L_2$ in the propagation direction. With such arrangements, it is possible to select and control microwave modes more effectively. Account may also be taken of more than one change in the waveguide cross-section.

It should also be noted that useful effects may be achieved by adjusting the distance between the mode filter and the plasma-forming region to optimize the stability and uniformity of the plasma. The mode filter may therefore be made movable in the waveguide in the propagation direction, and/or within its own level.

Figure 21:
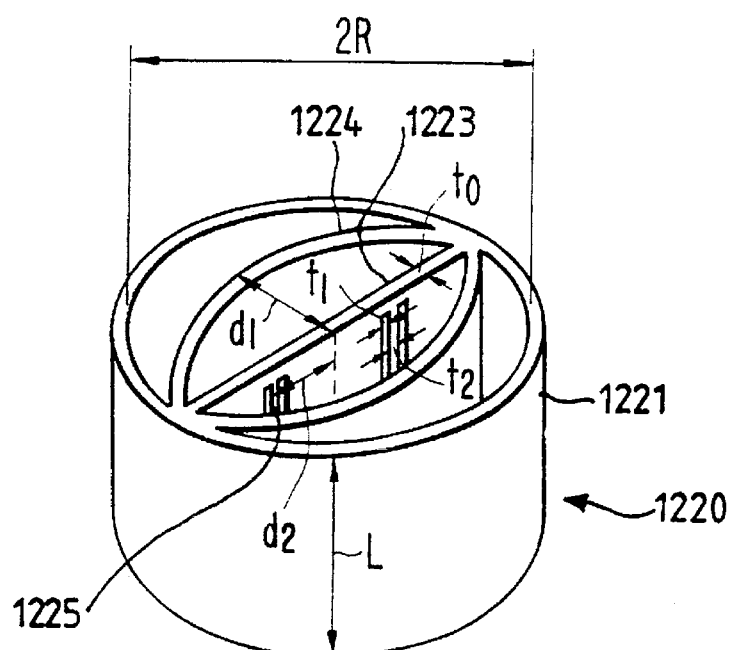
FIG. 21 is a perspective view of another example of a mode filter.
Figure 22:
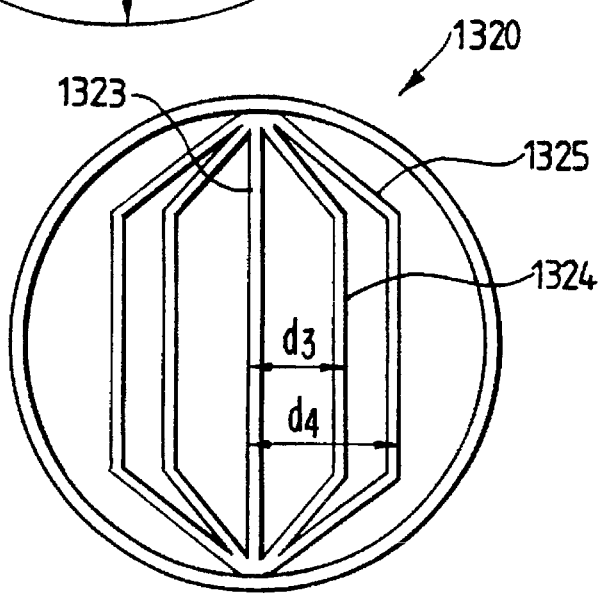
FIG. 22 is a transverse cross-section of a further example of a mode filter.

FIGS. 21 and 22 show further embodiments of a mode filter, similar in general principle to that of FIG. 4 and intended to pass the $TE_{11}$ mode. In the mode filter 1220 shown in FIG. 21, the outer metal cylinder 1221, of length L and inner diameter 2R, is divided into two halves by a flat partition plate 1223, and each half is subdivided by an arc-shaped partition plate 1224 whose center is at a distance $d_1$ from the cylinder center. In the mode filter, $$0.4 \leq d_1/R \leq 0.6$$

This is found to reduce the transmission factor of modes other than $TE_{11}$. The flat partition plate 1223 furthermore has slits 1225 at positions spaced by a distance $d_2$ from the cylinder center. We have found that such slits can enhance the mode selectivity. In the construction, $$0.3 \leq d_2/R \leq 0.4.$$

In this embodiment, the slits 1225 are arranged in two spaced pairs. The width $t_1$ of each slit is desirably related to the thickness $t_0$ of the plate 1223 as follows:

$$t_1/t_0 \leq 2$$

and the spacing $t_2$ between the slits in each pair may be approximately equal to the width of the slits.

The mode filter 1320 shown in FIG. 22 has a flat partition plate 1323, and partition plates 1324, 1325 which are trapezoidal instead of curved as in FIG. 21. These trapezoidal partition plates may be made by bending plates, or by connecting three flat plates. The mode filter 1320 shown has four of the trapezoidal partition plates. They disposed at the distance $d_3$ from the central plate 1323 to the inner plates 1324, and the distance $d_4$ from the central plate 1323 to the outer plates 1325, meeting the relationship $$0.35 \leq d_3/R < d_4/R \leq 0.65$$

If more than four partition plates are used, a similar effect can be obtained provided that four of them meet the requirements stated above.

FIGS. 23 to 26 illustrate some possible variations in the construction of the processing apparatus and the disposition of mode filters within the apparatus.

Figure 23:
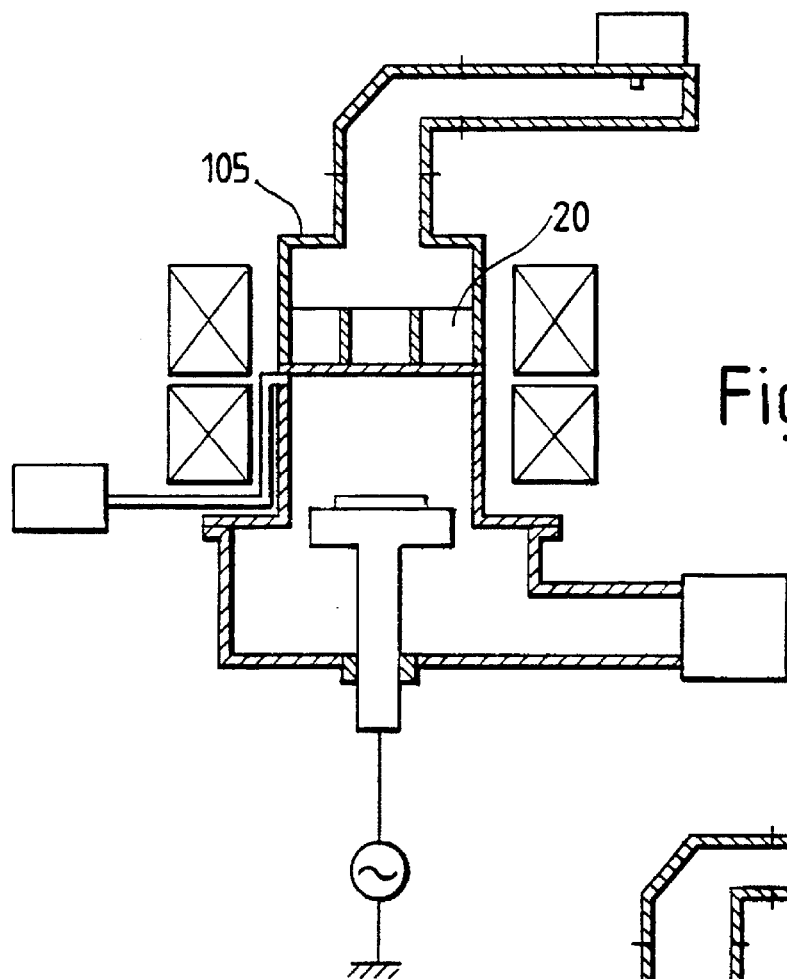
FIG. 23 is a vertical section of a second embodiment of a plasma processing apparatus.

The apparatus of FIG. 23 is similar to that of FIG. 2 except that the transition from the narrow-section portion to the portion of the waveguide is made at a perpendicular step 105. As mentioned previously, such a step does tend to cause mode mixing. However the effect of this can be largely obviated by the mode filter 20 positioned below the transition.

Figure 24:
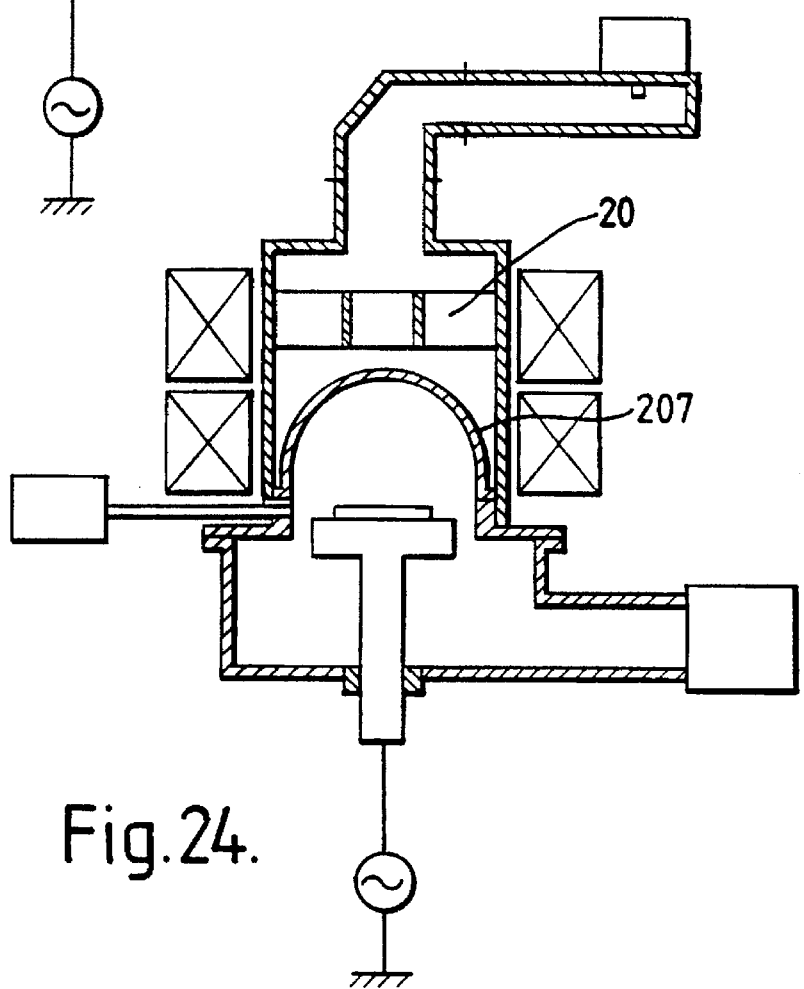
FIG. 24 is a vertical section of a third embodiment of a plasma processing apparatus.

FIG. 24 shows an apparatus in which the quartz cover 207 of the processing chamber is a dome, as in the prior art apparatus of FIG. 1. This is simple to make, but less preferred than the flat-window construction from the point of view of plasma uniformity. The mode filter 20 is spaced above the dome-shaped cover 207.

Figure 25:
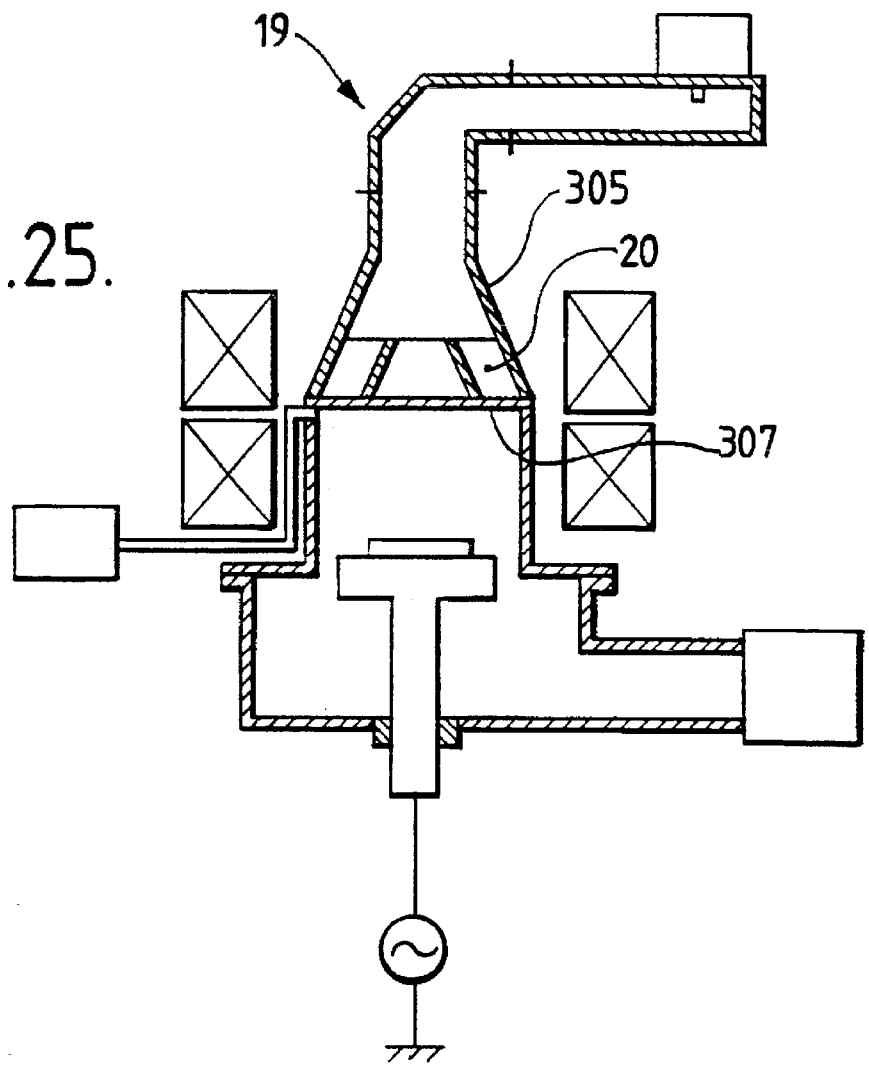
FIG. 25 is a vertical section of a fourth embodiment of a plasma processing apparatus.

FIG. 25 shows an apparatus in which, as in FIG. 2, the waveguide 19 has a tapering transition 305 from narrow to wide cross-section. However, in this embodiment, the taper continues until the waveguide meets the flat sealed cover window 307 of the processing chamber, and the mode filter 20 is constructed within the wide end of the taper. This enables the overall length of the waveguide and hence the equipment size to be reduced.

FIG. 26 shows an in-line apparatus in which the microwave generator 401 is directly above the processing chamber and connected thereto by a straight waveguide 419 having a rectangular-section portion 402, a rectangular-circular conversion portion 403 and a gently diverging portion 405 whose widest end is secured against the quartz cover plate 407 of the processing chamber. The apparatus has two mode filters, a first mode filter 20a installed in the largest-diameter portion of the diverging portion 405 and a second mode filter 20b installed inside the processing chamber. The metal vessel of the processing chamber has its inner wall surface, which forms a discharge element, covered with an insulating material 404 to prevent diffusion of impurities towards the specimen being processed. Typical diameters for the locations of the mode filters 20a, 20b are, e.g. 250 mm and 300 mm, respectively. The mode filters themselves may be, e.g. as described in FIG. 21 or FIG. 22, or according to any of the other mode filters described herein, particularly those which select the $TE_{11}$ mode.

Since mode filters are provided before and after the entrance to the processing chamber, mode stability and hence plasma stability are good.

Figure 27:
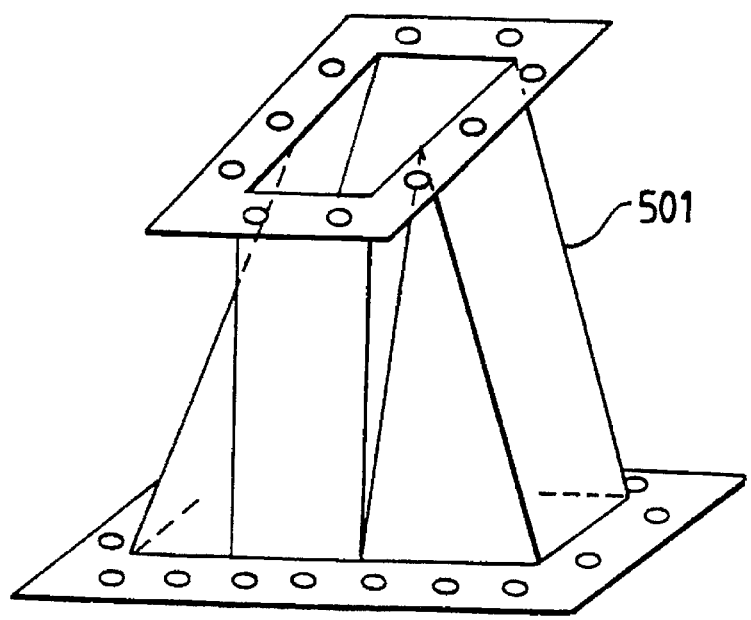
FIG. 27 is a perspective view of a mode-transfer guide construction.

In the embodiments of FIGS. 2 and 23 to 26, the microwave output from the microwave generator is guided through the rectangular waveguide and the circular/rectangular waveguide to the circular waveguide in order to facilitate propagation of the $TE_{11}$ mode in the large diameter circular waveguide. However, the present invention is not limited to this feature. For example, as FIGS. 27-28, a mode-transfer-waveguide 501 comprising a tapered guide having a rectangular inlet and a rectangular outlet which is rotated 90 degrees relative to the inlet, and whose long side is about twice as long as the long side of the rectangular inlet, may be used in lieu of the circular/rectangular waveguide. The mode-transfer waveguide 501 tends to convert microwaves of the $TE_{10}$ mode in the initial rectangular waveguide into microwaves of the $TE_{20}$ mode in the subsequent rectangular waveguide, in order to favor the propagation of microwaves of the $TE_{01}$ mode in the subsequent circular waveguide. In this case, it is possible to provide in a circular waveguide 502 a mode filter 503 having metal plates in a radiating arrangement as shown in FIG. 28 to reduce propagation other than in the $TE_{01}$ mode. Accordingly, since a high density portion of the plasma is equalized within an enlarged area, a sample of large diameter disposed in that enlarged area can be relatively uniformly processed.

We claim:

1. A plasma generating apparatus comprising:
   a microwave generator for generating microwaves;
   a processing chamber having a plasma-forming region therein;
   a waveguide coupled to the microwave generator and the processing chamber for enabling microwaves to propagate from the microwave generator to the processing chamber, the microwaves propagating in a plurality of propagation modes in at least one portion of the waveguide, the waveguide and the processing chamber constituting a microwave propagating assembly; and
   mode restricting means coupled to the microwave propagating assembly for restricting a number of propagation modes of microwaves arriving at the plasma-forming region to at least one predetermined propagation mode selected from the plurality of propagation modes, the at least one predetermined propagation mode being fewer in number than the plurality of propagation modes;
   wherein microwaves emerge from an outlet of the mode restricting means in a desired propagation state having the at least one predetermined propagation mode and propagate from the outlet of the mode restricting means to at least the plasma-forming region of the processing chamber in the desired propagation state in only the at least one predetermined propagation mode without any change in propagation state and propagation mode occurring.

2. A plasma generating apparatus according to claim 1, wherein the outlet of the mode restricting means is disposed in the waveguide.

3. A plasma generating apparatus according to claim 1, wherein the outlet of the mode restricting means is disposed in the processing chamber.

4. A plasma generating apparatus according to claim 1, wherein a total area of the cross section of the at least one portion of the waveguide is equal to a total area of the cross section of the processing chamber;
   wherein the mode restricting means has at least one microwave propagating portion through which microwaves propagate; and
   wherein a total cross-sectional area of the at least one microwave propagating portion of the mode restricting means is substantially equal to the total area of the cross section of the at least one portion of the waveguide.

5. A plasma generating apparatus according to claim 1, wherein the mode restricting means includes at least one divider for dividing the mode restricting means into a plurality of microwave propagating portions; and
   wherein a total cross-sectional area of the microwave propagating portions is greater than a total cross-sectional area of the at least one divider.

6. A plasma generating apparatus according to claim 1, wherein the mode restricting means includes at least one divider for dividing the mode restricting means into a plurality of microwave propagating portions; and wherein a thickness of each of the at least one divider is sufficiently small to avoid reflection of microwaves from an end of each of the at least one divider.

7. A plasma generating apparatus according to claim 1, wherein the mode restricting means includes at least one divider for dividing the mode restricting means into a plurality of microwave propagating portions; and wherein a length of each of the at least one divider in a microwave propagating direction is an integral multiple of one-quarter of a wavelength of microwaves propagating in the microwave propagating portions.

8. A plasma generating apparatus comprising:

a microwave generator for generating microwaves having a predetermined frequency;

a processing chamber having a plasma-forming region therein;

a waveguide coupled to the microwave generator and the processing chamber for enabling microwaves to propagate from the microwave generator to the processing chamber, at least one portion of the waveguide having a cross section with a dimension which enables microwaves having the predetermined frequency to propagate in $N_1$ propagation modes, where $N_1 \geq 2$, the waveguide and the processing chamber constituting a microwave propagating assembly; and mode restricting means coupled to the microwave propagating assembly for restricting a number of propagation modes of microwaves having the predetermined frequency arriving at the plasma-forming region to $N_2$ propagation modes selected from the $N_1$ propagation modes, where $1 \leq N_2 \leq N_1-1$;

wherein the waveguide includes:

a waveguide section coupled to the microwave generator and having a cross section with a first dimension which enables microwaves having the predetermined frequency to propagate in a single propagation mode; and a transitional waveguide section having a first end and a second end, the first end being coupled to the waveguide section and having a cross section with the first dimension, the second end being coupled to the processing chamber and having a cross section with a second dimension which enables microwaves having the predetermined frequency to propagate in the $N_1$ propagation modes, the second dimension being greater than the first dimension, the transitional waveguide section enabling microwaves to propagate from the waveguide section to the processing chamber while converting microwaves having the predetermined frequency propagating in the single propagation mode at the first end of the transitional waveguide section into microwaves having the predetermined frequency propagating in the $N_1$ propagation modes at the second end of the transitional waveguide section; and wherein the mode restricting means includes:

a first mode filter disposed in the transitional waveguide section for enabling only microwaves having the predetermined frequency propagating in the $N_2$ propagation modes to propagate past the first mode filter; and a second mode filter disposed in the processing chamber for enabling only microwaves having the predetermined frequency propagating in the $N_2$ propagation modes to propagate past the second mode filter.

9. A plasma generating apparatus according to claim 8, wherein the first mode filter has a cross section with the second dimension;

wherein the processing chamber has a cross section with a third dimension, the third dimension being greater than the second dimension; and wherein the second mode filter has a cross section with the third dimension.

10. A plasma generating apparatus according to claim 9, wherein the cross section of the second end of the transitional waveguide section and the cross section of the processing chamber are each a circular cross section.

11. A plasma generating apparatus comprising:

a microwave generator for generating microwaves having a predetermined frequency;

a processing chamber having a plasma-forming region therein;

a waveguide coupled to the microwave generator and the processing chamber for enabling microwaves to propagate from the microwave generator to the processing chamber, at least one portion of the waveguide having a cross section with a dimension which enables microwaves having the predetermined frequency to propagate in $N_1$ propagation modes, where $N_1 \geq 2$, the waveguide and the processing chamber constituting a microwave propagating assembly; and mode restricting means coupled to the microwave propagating assembly for restricting a number of propagation modes of microwaves having the predetermined frequency arriving at the plasma-forming region to $N_2$ propagation modes selected from the $N_1$ propagation modes, where $1 \leq N_2 \leq N_1-1$;

wherein the waveguide includes:

a waveguide section coupled to the microwave generator and having a cross section with a first dimension which enables microwaves having the predetermined frequency to propagate in a single propagation mode; and a transitional waveguide section having a first end and a second end, the first end being coupled to the waveguide section and having a cross section with the first dimension, the second end being coupled to the processing chamber and having a cross section with a second dimension which enables microwaves having the predetermined frequency to propagate in the $N_1$ propagation modes, the second dimension being greater than the first dimension, the transitional waveguide section enabling microwaves to propagate from the waveguide section to the processing chamber while converting microwaves having the predetermined frequency propagating in the single propagation mode at the first end of the transitional waveguide section into microwaves having the predetermined frequency propagating in the $N_1$ propagation modes at the second end of the transitional waveguide section; and wherein the mode restricting means includes a mode filter disposed in the transitional waveguide section for enabling only microwaves having the predetermined frequency propagating in the $N_2$ propagation modes to propagate past the mode filter.

12. A plasma generating apparatus according to claim 11, wherein the mode filter has a cross section with the second dimension.

13. A plasma generating apparatus according to claim 12, wherein the processing chamber has a cross section with a dimension not greater than the second dimension.

14. A plasma generating apparatus according to claim 13, wherein the cross section of the second end of the transitional waveguide section and the cross section of the processing chamber are each a circular cross section.

15. A plasma generating apparatus comprising:
a microwave generator for generating microwaves having a predetermined frequency;
a processing chamber having a plasma-forming region therein;
a waveguide coupled to the microwave generator and the processing chamber for enabling microwaves to propagate from the microwave generator to the processing chamber, at least one portion of the waveguide having a cross section with a dimension which enables microwaves having the predetermined frequency to propagate in $N_1$ propagation modes, where $N_1 \geq 2$, the waveguide and the processing chamber constituting a microwave propagating assembly; and
mode restricting means coupled to the microwave propagating assembly for restricting a number of propagation modes of microwaves having the predetermined frequency arriving at the plasma-forming region to $N_2$ propagation modes selected from the $N_1$ propagation modes, where $2 \leq N_2 \leq N_1 - 1$;
wherein microwaves emerge from an outlet of the mode restricting means in a desired propagation state having the $N_2$ propagation modes and propagate from the outlet of the mode restricting means to at least the plasma-forming region of the processing chamber in the desired propagation state in only the $N_2$ propagation modes without any change in propagation state and propagation mode occurring.

16. A plasma generating apparatus according to claim 15, wherein each of the $N_2$ propagation modes contributes a respective portion of a total amount of microwave energy arriving at the plasma-forming region; and
wherein the $N_2$ propagation modes include a selected propagation mode which contributes a greater portion of the total amount of microwave energy arriving at the plasma-forming region than any other one propagation mode of the $N_2$ propagation modes.

17. A plasma generating apparatus according to claim 16, wherein the selected propagation mode is the $TE_{11}$ propagation mode.

18. A plasma generating apparatus according to claim 16, wherein the selected propagation mode contributes at least 80% of the total amount of microwave energy arriving at the plasma-forming region.

19. A plasma generating apparatus according to claim 18, wherein the selected propagation mode is the $TE_{11}$ propagation mode.

20. A plasma generating apparatus according to claim 18, wherein the selected propagation mode contributes at least 90% of the total amount of microwave energy arriving at the plasma-forming region.

21. A plasma generating apparatus according to claim 20, wherein the selected propagation mode is the $TE_{11}$ propagation mode.

22. A plasma generating apparatus according to claim 15, wherein a total area of the cross section of the at least one portion of the waveguide is equal to a total area of the cross section of the processing chamber;
wherein the mode restricting means has at least one microwave propagating portion through which microwaves propagate; and
wherein a total cross-sectional area of the at least one microwave propagating portion of the mode restricting means is substantially equal to the total area of the cross section of the at least one portion of the waveguide.

23. A plasma generating apparatus according to claim 15, wherein the mode restricting means includes at least one divider for dividing the mode restricting means into a plurality of microwave propagating portions; and
wherein a total cross-sectional area of the microwave propagating portions is greater than a total cross-sectional area of the at least one divider.

24. A plasma generating apparatus according to claim 15, wherein the mode restricting means includes at least one divider for dividing the mode restricting means into a plurality of microwave propagating portions; and
wherein a thickness of each of the at least one divider is sufficiently small to avoid reflection of microwaves from an end of each of the at least one divider.

25. A plasma generating apparatus according to claim 15, wherein the mode restricting means includes at least one divider for dividing the mode restricting means into a plurality of microwave propagating portions; and
wherein a length of each of the at least one divider in a microwave propagating direction is an integral multiple of one-quarter of a wavelength of microwaves propagating in the microwave propagating portions.

26. A plasma generating apparatus comprising:
a microwave generator for generating microwaves having a predetermined frequency;
a processing chamber having a plasma-forming region therein;
a waveguide coupled to the microwave generator and the processing chamber for enabling microwaves to propagate from the microwave generator to the processing chamber, at least one portion of the waveguide having a cross section with a dimension which enables microwaves having the predetermined frequency to propagate in $N_1$ propagation modes, where $N_1 \geq 2$, the waveguide and the processing chamber constituting a microwave propagating assembly; and
mode restricting means coupled to the microwave propagating assembly for restricting a number of propagation modes of microwaves having the predetermined frequency arriving at the plasma-forming region to $N_2$ propagation modes selected from the $N_1$ propagation modes, where $1 \leq N_2 \leq N_1 - 1$;
wherein the dimension of the cross section of the at least one portion of the waveguide is equal to a dimension of a cross section of the processing chamber.

27. A plasma generating apparatus according to claim 26, wherein microwaves emerge from an outlet of the mode restricting means in a desired propagation state having the $N_2$ propagation modes and propagate from the outlet of the mode restricting means to at least the plasma-forming region of the processing chamber in the desired propagation state in only the $N_2$ propagation modes without any change in propagation state and propagation mode occurring.

28. A plasma generating apparatus according to claim 27, wherein the outlet of the mode restricting means is disposed in the waveguide.

29. A plasma generating apparatus according to claim 27, wherein the outlet of the mode restricting means is disposed in the processing chamber.

30. A plasma generating apparatus according to claim 26, wherein the $N_2$ propagation modes are predetermined propagation modes selected from the $N_1$ propagation modes.

31. A plasma generating apparatus according to claim 26, wherein $N_2 = 1$, such that the $N_2$ propagation modes consist of a single propagation mode.

32. A plasma generating apparatus according to claim 31, wherein the single propagation mode is the $TE_{11}$ propagation mode.

33. A plasma generating apparatus according to claim 26, wherein the $N_2$ propagation modes are selected from the group consisting of the $TE_{01}$, $TE_{10}$, $TE_{11}$, $TM_{01}$, $TM_{10}$, and $TM_{11}$ propagation modes.

34. A plasma generating apparatus according to claim 33, wherein $N_2=1$, such that the $N_2$ propagation modes consist of a single propagation mode selected from the group consisting of the $TE_{01}$, $TE_{10}$, $TE_{11}$, $TM_{01}$, $TM_{10}$, and $TM_{11}$ propagation modes.

35. A plasma generating apparatus according to claim 34, wherein the single propagation mode is the $TE_{11}$ propagation mode.

36. A plasma generating apparatus according to claim 26, wherein the waveguide includes:

a first waveguide section coupled to the microwave generator and having a cross section with a first dimension which enables microwaves having the predetermined frequency to propagate in a single propagation mode;

a second waveguide section coupled to the processing chamber and having a cross section with a second dimension which enables microwaves having the predetermined frequency to propagate in the $N_1$ propagation modes, the second dimension being greater than the first dimension; and a transitional waveguide section coupled to the first waveguide section and the second waveguide section for enabling microwaves to propagate from the first waveguide section to the second waveguide section while converting microwaves having the predetermined frequency propagating in the single propagation mode in the first waveguide section into microwaves having the predetermined frequency propagating in the $N_1$ propagation modes in the second waveguide section.

37. A plasma generating apparatus according to claim 36, wherein the transitional waveguide section has a first end and a second end, the first end being coupled to the first waveguide section and having a cross section with the first dimension, the second end being coupled to the second waveguide section and having a cross section with the second dimension.

38. A plasma generating apparatus according to claim 36, wherein the mode restricting means includes a mode filter disposed in the second waveguide section for enabling only microwaves having the predetermined frequency propagating in the $N_2$ propagation modes to propagate past the mode filter.

39. A plasma generating apparatus according to claim 38, wherein the mode filter has a cross section with the second dimension.

40. A plasma generating apparatus according to claim 39, wherein the processing chamber has a cross section with a dimension not greater than the second dimension.

41. A plasma generating apparatus according to claim 40, wherein the cross section of the second waveguide section and the cross section of the processing chamber are each a circular cross section.

42. A plasma generating apparatus according to claim 26, wherein a total area of the cross section of the at least one portion of the waveguide is equal to a total area of the cross section of the processing chamber;

wherein the mode restricting means has at least one microwave propagating portion through which microwaves propagate; and wherein a total cross-sectional area of the at least one microwave propagating portion of the mode restricting means is substantially equal to the total area of the cross section of the at least one portion of the waveguide.

43. A plasma generating apparatus according to claim 26, wherein the mode restricting means includes at least one divider for dividing the mode restricting means into a plurality of microwave propagating portions; and wherein a total cross-sectional area of the microwave propagating portions is greater than a total cross-sectional area of the at least one divider.

44. A plasma generating apparatus according to claim 26, wherein the mode restricting means includes at least one divider for dividing the mode restricting means into a plurality of microwave propagating portions; and wherein a thickness of each of the at least one divider is sufficiently small to avoid reflection of microwaves from an end of each of the at least one divider.

45. A plasma generating apparatus according to claim 26, wherein the mode restricting means includes at least one divider for dividing the mode restricting means into a plurality of microwave propagating portions; and wherein a length of each of the at least one divider in a microwave propagating direction is an integral multiple of one-quarter of a wavelength of microwaves propagating in the microwave propagating portions.

46. A plasma generating apparatus comprising:

a microwave generator for generating microwaves having a predetermined frequency;

a processing chamber having a plasma-forming region therein;

a waveguide coupled to the microwave generator and the processing chamber for enabling microwaves to propagate from the microwave generator to the processing chamber, at least one portion of the waveguide having a cross section with a dimension which enables microwaves having the predetermined frequency to propagate in $N_1$ propagation modes, where $N_1 \geq 2$, the waveguide and the processing chamber constituting a microwave propagating assembly; and mode restricting means coupled to the microwave propagating assembly for restricting a number of propagation modes of microwaves having the predetermined frequency arriving at the plasma-forming region to $N_2$ propagation modes selected from the $N_1$ propagation modes, where $1 \leq N_2 \leq N_1 - 1$;

wherein the dimension of the cross section of the at least one portion of the waveguide is equal to a dimension of a cross section of the processing chamber; and wherein microwaves having the $N_2$ propagation modes propagate through the mode restricting means.

* * * * *